US 8,928,411 B2

(12) United States Patent
Parker et al.

(10) Patent No.: US 8,928,411 B2
(45) Date of Patent: Jan. 6, 2015

(54) INTEGRATION OF SIGNAL SAMPLING WITHIN TRANSISTOR AMPLIFIER STAGE

(71) Applicant: Silicon Image, Inc., Sunnyvale, CA (US)

(72) Inventors: James R. Parker, Palo Alto, CA (US); Sohrab Emami, San Francisco, CA (US)

(73) Assignee: Silicon Image, Inc., Sunnyvale, CA (US)

( * ) Notice: Subject to any disclaimer, the term of this patent is extended or adjusted under 35 U.S.C. 154(b) by 27 days.

(21) Appl. No.: 13/836,895

(22) Filed: Mar. 15, 2013

(65) Prior Publication Data

US 2014/0184341 A1 Jul. 3, 2014

Related U.S. Application Data

(60) Provisional application No. 61/749,253, filed on Jan. 4, 2013, provisional application No. 61/748,010, filed on Dec. 31, 2012.

(51) Int. Cl.
*H03F 3/16* (2006.01)
*H03F 3/193* (2006.01)

(52) U.S. Cl.
CPC .................................. *H03F 3/193* (2013.01)
USPC .......................................... 330/277; 330/307

(58) Field of Classification Search
USPC ............... 330/277, 307, 302, 295, 84, 126
See application file for complete search history.

(56) References Cited

U.S. PATENT DOCUMENTS

| 7,330,077 | B2 | 2/2008 | Arnborg | |
|---|---|---|---|---|
| 7,928,517 | B2 | 4/2011 | Tiemeijer | |
| 8,008,977 | B2 * | 8/2011 | Tserng et al. | 330/311 |
| 2009/0174482 | A1 * | 7/2009 | Blednov | 330/277 |
| 2009/0179702 | A1 * | 7/2009 | Blednov | 330/277 |
| 2010/0264988 | A1 * | 10/2010 | Huang et al. | 330/277 |
| 2011/0121389 | A1 | 5/2011 | De Boet et al. | |
| 2012/0081180 | A1 | 4/2012 | Lee | |
| 2012/0086497 | A1 | 4/2012 | Vorhaus | |

FOREIGN PATENT DOCUMENTS

| KR | 10-2007-0024736 A | 3/2007 |
|---|---|---|
| KR | 10-2007-0088307 A | 8/2007 |

OTHER PUBLICATIONS

PCT International Search Report, PCT Application No. PCT/US2013/070801, Feb. 26, 2014, 9 pages.

* cited by examiner

*Primary Examiner* — Henry Choe
(74) *Attorney, Agent, or Firm* — Fenwick & West LLP

(57) ABSTRACT

Embodiments of the invention are generally directed to integration of signal sampling within a transistor amplifier stage. An embodiment of an apparatus includes a amplifier stage including a transistor to receive a source signal and produce an output signal, wherein the transistor includes multiple fingers for at least a first electrode of the transistor. The amplifier stage uses connections to some of the fingers of the first electrode for production of the output signal, and uses one or more other fingers for the first electrode of the transistor for a separate function from the production of the output signal.

15 Claims, 4 Drawing Sheets

INTEGRATION OF SIGNAL SAMPLING WITHIN TRANSISTOR AMPLIFIER STAGE

CROSS-REFERENCE TO RELATED APPLICATIONS

This application claims the benefit of priority from U.S. Provisional Patent Application No. 61/748,010 filed Dec. 31, 2012 and U.S. Provisional Patent Application No. 61/749,253 filed Jan. 4, 2013, which are incorporated herein by reference in their entirety.

TECHNICAL FIELD

Embodiments of the invention generally relate to the field of electronic devices, and, more particularly, to integration of signal sampling within a transistor amplifier stage.

BACKGROUND

Various devices or components utilize signal waveforms to measure signal values or otherwise develop data related to the signal. For example, a power detector, such as an RF (Radio Frequency) power detector, monitors a signal waveform and provides a DC (Direct Current) output voltage corresponding to the power of the signal. Power detectors are used extensively to measure and control RF signal strength in wireless systems. In transmitters, transmit power control is critical to ensure compliance with regulatory guidelines and for maintaining the range and quality of the radio link. In receivers, received signal strength is used for gain control in the RF/IF chain to maintain a constant signal level suitable for analog-to-digital conversion and demodulation.

Conventional techniques used to obtain a sample of the RF power to be monitored by the power detector include:

(1) Use of dedicated signal chains that replicate the RF signal path but with the final load or antenna replaced by a power detector. However, the implementation of a dedicated signal chain to replicate the signal path is wasteful of both power in operation and of silicon area for an RF amplifier.

(2) Sampling of a small portion of the output from the RF signal path via a directional coupler or capacitively coupled line, and sending this sampled signal to a dedicated power detector. However, this approach also consumes significant area in a device for the coupling lines, and limits placement of the coupling section within the layout of multi-stage amplifiers. Further, the coupling can be sensitive to and/or impact the impedance matching of the main signal path.

In both of these conventional approaches, after a sample or replica of the RF signal is obtained, such sample or replica is normally fed to a dedicated power detector circuit for conversion to a DC voltage. Even in a simple implementation, this requires an additional power detector device, such as a simple diode rectifier detector or NMOS (N-type Metal Oxide Semiconductor) power detector, and filtering circuitry.

BRIEF DESCRIPTION OF THE DRAWINGS

Embodiments of the invention are illustrated by way of example, and not by way of limitation, in the figures of the accompanying drawings in which like reference numerals refer to similar elements.

SUMMARY

Figure 1:
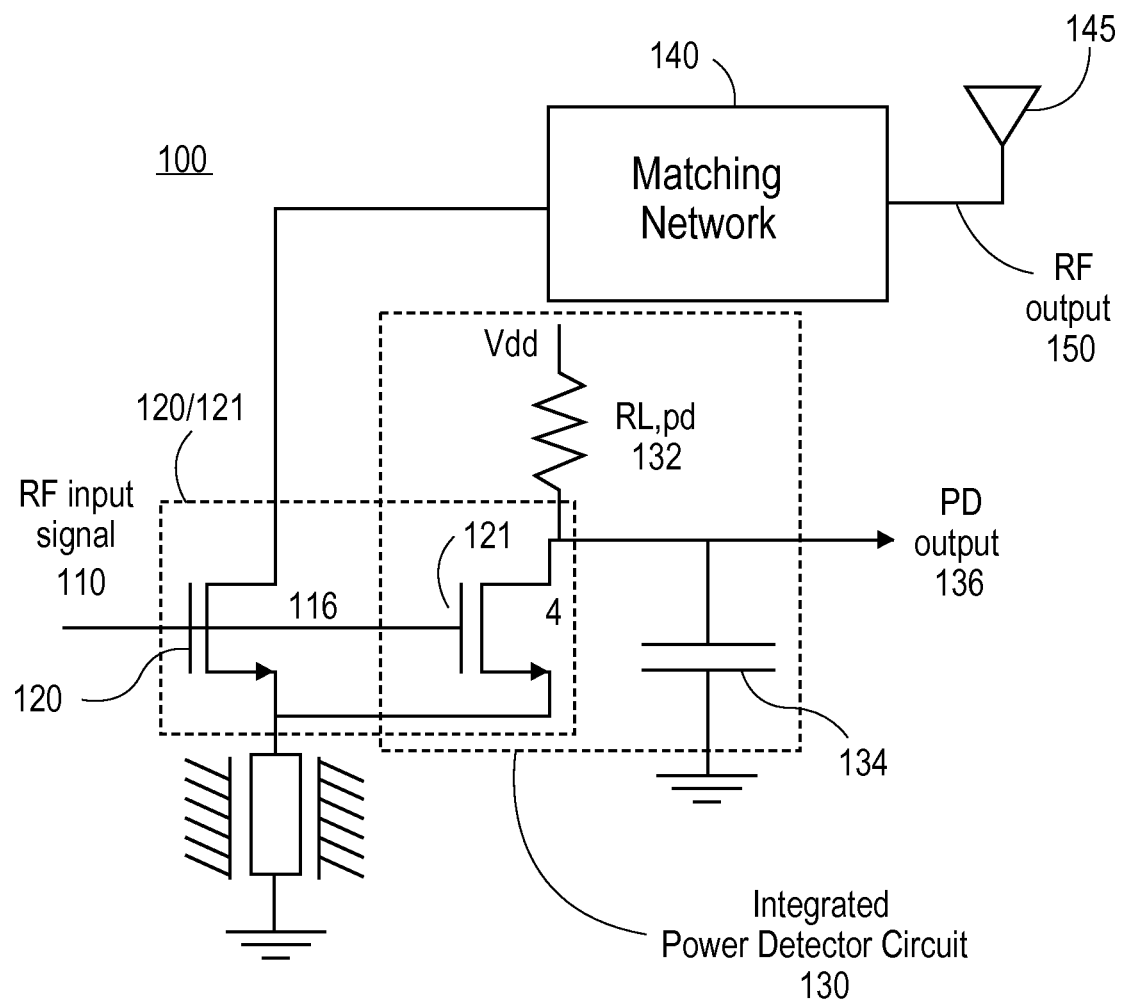
FIG. 1 illustrates a power detector integrated within a power transistor amplifier stage according to an embodiment.

Embodiments of the invention are generally directed to integration of signal sampling within a transistor amplifier stage.

In a first aspect of the invention, an embodiment of an apparatus includes an amplifier stage including a transistor to receive a source signal and produce an output signal, wherein the transistor includes multiple fingers for at least a first electrode of the transistor. The amplifier stage uses connections to a first subset of the plurality of fingers of the first electrode for production of the output signal, and uses a second subset of plurality of fingers, including one or more other fingers of the first electrode, of the transistor for a separate function from the production of the output signal.

In a second aspect of the invention, a method includes receiving a signal source at an amplifier stage, the amplifier stage including a transistor having a plurality of electrodes including a first electrode; producing an output signal from the amplifier stage, wherein producing the output signal includes obtaining a signal from a first subset of fingers of a plurality of fingers of the first electrode; and performing a function that is separate from the production of the output signal, wherein performing the function includes obtaining a signal from a second subset of fingers of the plurality of fingers of the first electrode.

DETAILED DESCRIPTION

Embodiments of the invention are generally directed to integration of signal sampling within a transistor amplifier stage.

In some embodiments, an apparatus includes an amplifier stage, the amplifier stage including a transistor to receive a source signal and produce an output signal, wherein the transistor includes multiple fingers for at least a first electrode of the transistor, and wherein the amplifier stage uses connections to some (a first subset) of the fingers of the first electrode for production of the output signal, and uses one or more (a second subset) of the fingers for the first electrode of the transistor for a separate function from the production of the output signal. In some embodiments, multiple electrodes of a transistor may be tapped to affect signals at such electrodes.

In some embodiments, a portion of a power amplifier transistor, such as the power amplifier of an RF power stage, is used to obtain a sample of an RF signal. In some embodiments, the power transistor simultaneously acts as both a power amplifier and as a portion of the power detector circuit.

A power transistor may include an NMOS, CMOS (Complementary Metal Oxide Semiconductor), or similar technology device. In a transistor, a signal chain device may include a comb or finger structure for the output electrode that provides the signal output, where the multiple fingers may, for example, allow for reducing the length of polysilicon through which current is required to flow.

In some embodiments, a power detector device is integrated within a power transistor, such as a CMOS or NMOS RF power transistor amplifier stage, by tapping off a small portion of the signal chain device. In some embodiments, a relatively small number of fingers from a multiple finger transistor layout are tapped off for purposes of a power detector circuit, which may further rectify and/or filter an output signal, such as an RF output signal. While the implementations described herein generally refer to an RF power transistor amplifier and an RF signal path, embodiments are not limited to RF frequencies.

In some embodiments, an integrated power detector circuit is configured to obtain a duplicate signal of a power signal output of a power transistor amplifier stage. In some embodiments, the "tapped" fingers of a combined power amplifier/power detector are connected to the same input matching and input signals as the main power amplifier so that a sample waveform is a duplicate of the main signal path waveform.

In some embodiments, a multi-finger RF transistor layout is modified so that a certain number of the device drain (or source) connections are disconnected from the RF signal path, and such device connections are instead routed to a power detector circuit that converts the sampled RF waveform to a DC voltage. If the area of the "tapped" fingers is small compared to the overall area of RF power device fingers, and the tapping/routing of the power detector signal is handled appropriately, then an impact on the RF amplifier is reduced and the additional area in the transistor circuit required for the detection circuit can be small.

FIG. 1 illustrates a power detector integrated within a power transistor amplifier stage according to an embodiment. FIG. 1 provides a simplified schematic view of an implementation, and does not include all components that may be present in a circuit. FIG. 1 provides a schematic representation of an embodiment of an integrated or tapped power detector implementation using a tapped-drain configuration. While FIG. 1 and other Figures illustrate a particular example of an integrated power detector, embodiments are not limited to this example, and may include integration of any separate function utilizing a signal from one or more of the fingers of an electrode of the transistor.

As illustrated in FIG. 1, an RF power transistor amplifier stage 100 receives an RF input signal 110 at the gate of an NMOS power transistor 120/121. In some embodiments, a certain number of fingers of the drain electrode of the power transistor are tapped to form a power detector. In this example, four drain fingers from a 120-finger NMOS layout are "tapped" and re-routed to form part of the power detector (PD) circuit and low-pass filter. This is shown schematically as a first transistor 120 utilizing one hundred sixteen (116) of the fingers of the power transistor and a second transistor 121 utilizing the remaining four (4) fingers of a terminal of the power transistor.

Thus, in FIG. 1, transistor 120 and 121 are shown for simplicity of illustration as two separate transistors. However, in an actual implementation these are portions of a single multi-finger NMOS power transistor 120/121 in which the layout has been modified to re-route a small number of the fingers of a terminal of the power transistor. In this example, the transistor bias, gate and source terminal connections, and the applied input signal (RF input signal 110), are common to the main composite transistor, which comprises first transistor 120, and the tapped drain portion, the tapped drain portion being represented in FIG. 1 as second transistor 121. While in this example a certain number of fingers of the drain are tapped for integration of power detection, multiple fingers of source or gate electrodes may alternatively be tapped.

In some embodiments, the RF power transistor amplifier stage 100 includes an integrated power detector circuit 130, including the tapped drain portion 121 of the power transistor 120/121, a load resistance shown as resistor RL 132 and a low pass filter shown as capacitance 134, to convert the sampled RF waveform to a DC voltage output, shown and power detector (PD) output 136.

As further illustrated in FIG. 1, a drain of main transistor portion 120 is coupled with a matching network 140 to produce the RF signal output 150, illustrated as being provided for transmission via antenna 145.

In some embodiments, using a very small portion of an existing RF transistor as the power detector device removes the need for a dedicated sampling circuit and a separate power detector device for the power amplifier stage 100, thus saving area in a device in both cases.

In one implementation, use of the tapped power detector approach to create an integrated power detector for a power amplifier may provide an additional advantage that sensitivity of the power detector output to the final RF load impedance can be mitigated by incorporating the power detector into driver amplifier stages that are at least partially buffered from the final load impedance. This may be implemented, for example, with coupled line solutions that might not be compatible with the inter-stage matching networks.

Figure 2:
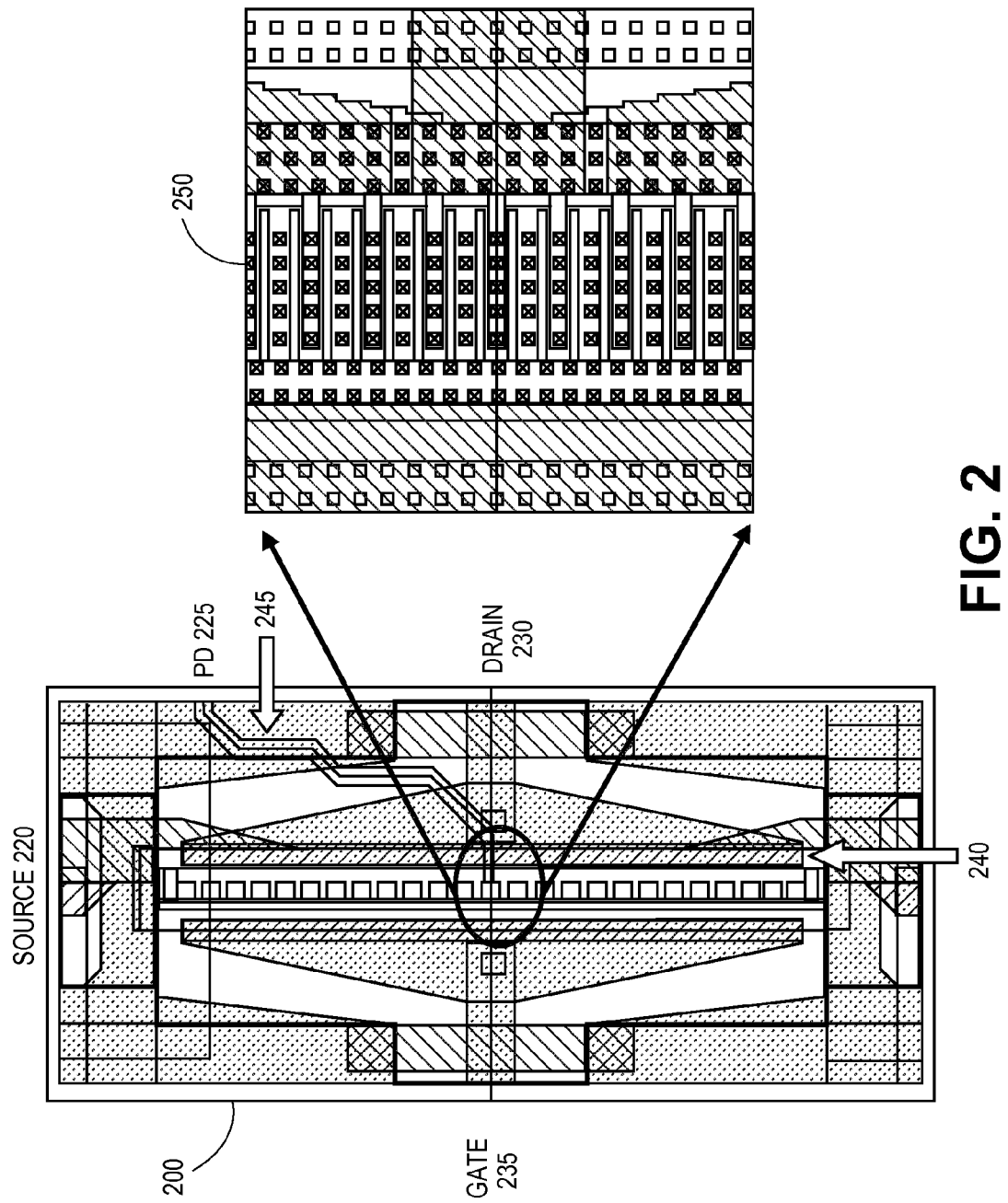
FIG. 2 illustrates a layout realization of an embodiment of tapped signal sampling.

FIG. 2 illustrates a layout realization of an embodiment of tapped signal sampling. In some embodiments, tapped signal sampling may be utilized for power detection. FIG. 2 provides a layout view of a multi-finger RF NMOS transistor layout incorporating a drain-tapped power detector connection. In this illustration, a complete transistor 200 is illustrated on the left side of FIG. 2, with RF gate 235 and drain 230 metal connections being shown on the left and right sides of the transistor 200 respectively. In the illustrated embodiment of FIG. 2, the transistor device 200 consists of 120 gate fingers, the drain nodes corresponding to 4 of the gate fingers 240 have been disconnected from the RF signal path on the drain side and routed out separately 245 for, for example, the power detector function PD 225. However, embodiments are not limited to the implementation of a power detector function. A close-up of a center portion 250 of the transistor is illustrated on the right side of FIG. 2, where the center portion 250 illustrates the split drain tap of the transistor.

In some embodiments, multiple electrodes of a transistor are tapped, and the fingers of the electrodes may be used for other purposes. In an example, a second electrode may include a second plurality of fingers, the second plurality of fingers including a subset of fingers, wherein the subset of the second plurality of figures is used to control a response of the separate signal sampling function. For example, a drain terminal and a source terminal may be tapped in order to modify the bias on the signal sampling portion of the transistor.

In some embodiments, the source or gate fingers of the MOS transistor can also be tapped, and the tapped fingers of the source or gate may also be used to obtain an RF waveform for power detection. The choice of which internal node of the power transistor to choose for implementation of the taps may depend on the specifics of the RF waveform and signal path design. However, the same general principles for incorporating a power detector in a power transistor amplifier stage embodiment apply to such implementations.

While the illustration here is of a MOS transistor, embodiments are not limited to MOS transistors, and may be utilized in other transistors including multiple terminal fingers. In some embodiments, a power detector may be integrated into a power transistor stage that includes a MESFET (Metal Semiconductor Field Effect Transistor) or bipolar transistor using multiple collector or emitter terminal fingers. Further, embodiments are not limited to RF frequency operation of an amplifier.

Figure 3:
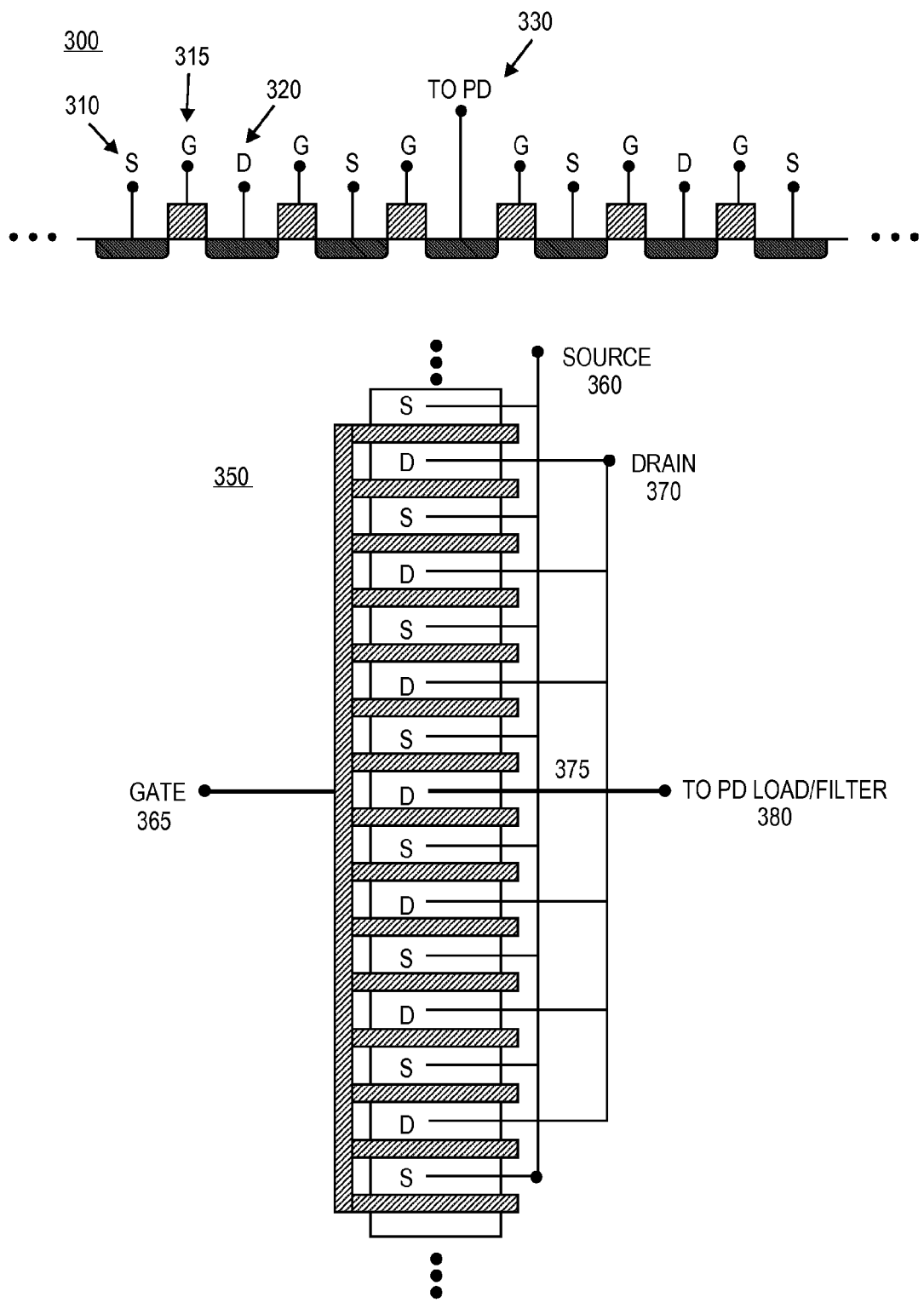
FIG. 3 is an illustration of a multi-finger RF power device layout with integrated signal sampling according to an embodiment.

FIG. 3 is an illustration of a multi-finger RF power device layout with integrated signal sampling according to an embodiment, wherein signal sampling may, for example, include power detection operations. In some embodiments, certain of the drain nodes, such as one or more of the central drain nodes, of a multiple finger device are tapped and re-routed to provide RF signal to the load and filter of an integrated power detector circuit, such as the power detector circuit 130 shown in FIG. 1.

In FIG. 3, a first view 300 of the power device illustrates the terminals for the source 310, gate 315, and drain 320. In some embodiments, certain of the drain nodes, such as central drain node 330 are tapped and routed separately to the integrated power detector circuit. FIG. 3 further shows a second view 350 of the power device illustrating the gate terminal 365 for the gate nodes, the source terminal 360 for the source nodes (S), and the drain terminal 370 for the drain nodes (D). In some embodiments, one or more of the drain nodes, such as drain node 375, which is one of the central drain nodes in the layout, is tapped and routed separately to the integrated power detector circuit 380.

Figure 4:
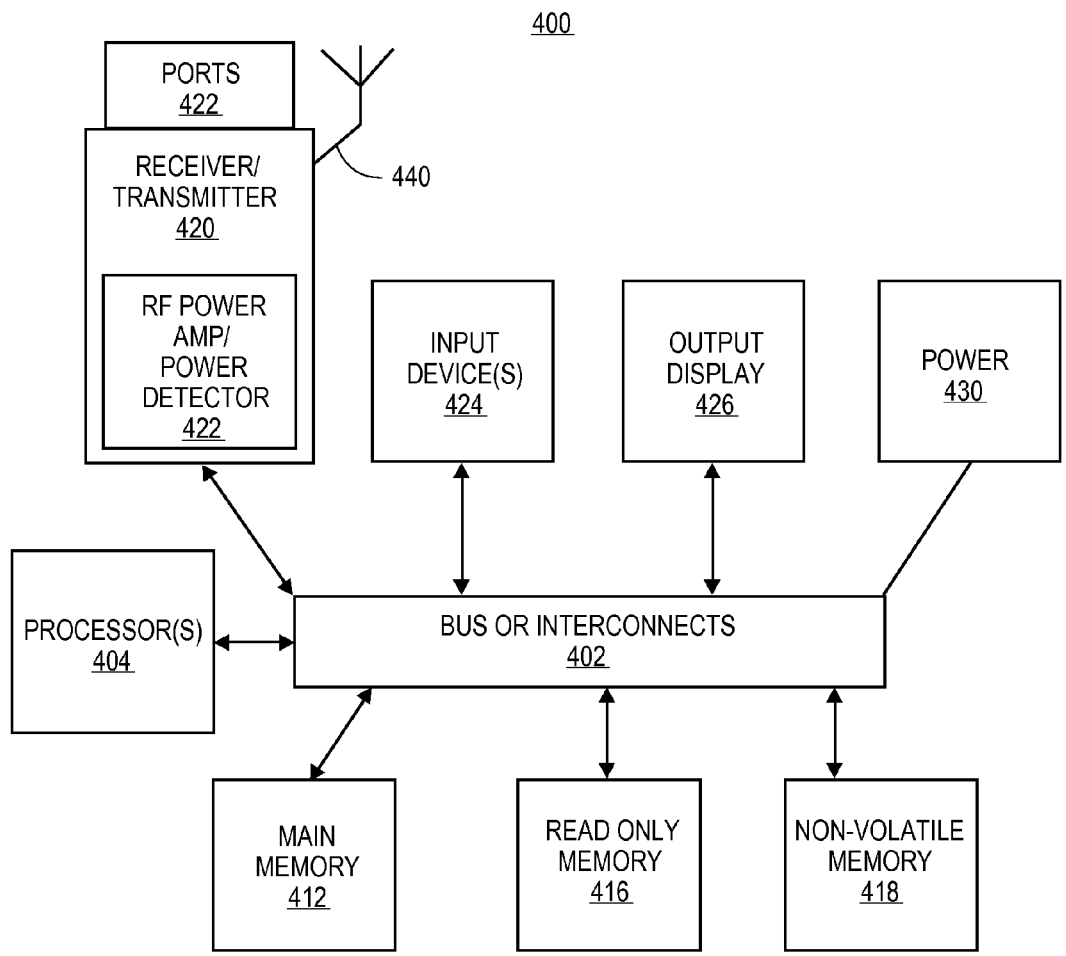
FIG. 4 is an illustration of an apparatus or system including integrated signal sampling in a power amplifier stage.

FIG. 4 is an illustration of an apparatus or system including integrated signal sampling in a power amplifier stage. In some embodiments, the apparatus or system utilizes the integrated signal sampling to perform a function separate from producing an output signal, including the operation of an integrated power detector to measure power output of a power transistor stage. However, embodiments are not limited to an integrated power detector, and may include the use of integrated signal sampling for other functions.

In some embodiments, an apparatus or system 400 (referred to here generally as an apparatus) comprises an interconnect or crossbar 402 or other communication means for transmission of data. One or more transmitters or receivers 420 may be coupled to the interconnect 402. In some embodiments, the receivers or transmitters 420 may include one or more ports 422 for the connection of other apparatuses, and may include an antenna 440 for the broadcast of RF signal.

In some embodiments, a transmitter 420 includes an RF power amplifier with integrated signal sampling including, for example, the illustrated integrated power detector 422. The RF power amplifier may be, for example, the RF power transistor amplifier stage 100 with integrated power detector circuit 130 illustrated in FIG. 1. In some embodiments, the apparatus may utilize the integrated power detector to measure power output of the power amplifier without requiring a dedicated sampling circuit and a separate power detector device for the power amplifier.

In some embodiments, the apparatus 400 may include multiple transmitters 420, including, for example, implementations in which the apparatus includes a phased array transmitter. In some embodiments, integrated power detectors 422 may be included on one, some, or all of the individual transmitters.

The apparatus 400 of FIG. 4 may further include the following elements or components:

The apparatus 400 may include a processing means such as one or more processors 404 coupled with the interconnect 402 for processing information. The processors 404 may comprise one or more physical processors and one or more logical processors.

The interconnect 402 is illustrated as a single interconnect for simplicity, but may represent multiple different interconnects or buses and the component connections to such interconnects or buses may vary. The interconnect 402 shown in FIG. 4 is an abstraction that represents any one or more separate physical buses, point-to-point connections, or both connected by appropriate bridges, adapters, or controllers.

In some embodiments, the apparatus 400 further comprises a random access memory (RAM) or other dynamic storage device or element as a main memory 412 for storing information and instructions to be executed by the processors 404. In some embodiments, main memory may include active storage of applications including a browser application for using in network browsing activities by a user of the apparatus 400. In some embodiments, memory of the apparatus may include certain registers or other special purpose memory.

The apparatus 400 also may comprise a read only memory (ROM) 416 or other static storage device for storing static information and instructions for the processors 404. The apparatus 400 may include one or more non-volatile memory elements 418 for the storage of certain elements, including, for example, flash memory and a hard disk or solid-state drive.

The apparatus 400 may include one or more input devices 424, which may include one or more of a keyboard, mouse, touch pad, voice command recognition, gesture recognition, sensors or monitors (including sensors or monitors providing power and performance data), or other device for providing an input to the apparatus 400.

The apparatus 400 may also be coupled via the interconnect 402 to an output display 426. In some embodiments, the display 426 may include a liquid crystal display (LCD) or any other display technology, for displaying information or content to a user, including three-dimensional (3D) displays. In some environments, the display 426 may include a touchscreen that is also utilized as at least a part of an input device. In some environments, the display 426 may be or may include an audio device, such as a speaker for providing audio information.

The apparatus 400 may also comprise a power device or apparatus 430, which may comprise a power supply, a battery, a solar cell, a fuel cell, or other system or device for providing or generating power. The power provided by the power device or system 430 may be distributed as required to elements of the apparatus 400.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form. There may be intermediate structure between illustrated components. The components described or illustrated herein may have additional inputs or outputs that are not illustrated or described. The illustrated elements or components may also be arranged in different arrangements or orders, including the reordering of any fields or the modification of field sizes.

The present invention may include various processes. The processes of the present invention may be performed by hardware components or may be embodied in computer-readable instructions, which may be used to cause a general purpose or special purpose processor or logic circuits programmed with the instructions to perform the processes. Alternatively, the processes may be performed by a combination of hardware and software.

Portions of the present invention may be provided as a computer program product, which may include a computer-readable non-transitory storage medium having stored thereon computer program instructions, which may be used to program a computer (or other electronic devices) to perform a process according to the present invention. The computer-readable storage medium may include, but is not limited to, floppy diskettes, optical disks, CD-ROMs (compact disk read-only memory), and magneto-optical disks, ROMs (read-only memory), RAMs (random access memory), EPROMs (erasable programmable read-only memory), EEPROMs (electrically-erasable programmable read-only memory), magnet or optical cards, flash memory, or other type of media/computer-readable medium suitable for storing electronic instructions. Moreover, the present invention may also be downloaded as a computer program product, wherein the program may be transferred from a remote computer to a requesting computer.

Many of the methods are described in their most basic form, but processes may be added to or deleted from any of the methods and information may be added or subtracted from any of the described messages without departing from the basic scope of the present invention. It will be apparent to those skilled in the art that many further modifications and adaptations may be made. The particular embodiments are not provided to limit the invention but to illustrate it.

If it is said that an element "A" is coupled to or with element "B," element A may be directly coupled to element B or be indirectly coupled through, for example, element C. When the specification states that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification refers to "a" or "an" element, this does not mean there is only one of the described elements.

An embodiment is an implementation or example of the invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects.

What is claimed is:

1. An apparatus comprising:
    an amplifier stage including a transistor to receive a source signal and produce an amplifier stage output signal, wherein the transistor includes a plurality of fingers for at least a first electrode of the transistor;
    wherein a first subset of the plurality of fingers of the first electrode is coupled to provide the amplifier stage output signal; and
    an integrated power detector circuit coupled to a second subset of the plurality of fingers, the integrated power detector circuit to generate a power detection output signal from the second subset of fingers of the first electrode.

2. The apparatus of claim 1, wherein the integrated power detector circuit further performs rectification of the power detection output signal.

3. The apparatus of claim 2, wherein the power detector circuit further includes a load resistance and a low pass filter.

4. The apparatus of claim 3, wherein the power detection output signal comprises a DC (Direct Current) voltage output.

5. The apparatus of claim 1, wherein the transistor further includes a second plurality of fingers for a second electrode of the transistor.

6. The apparatus of claim 5, wherein the second plurality of fingers includes a subset of fingers, wherein the subset of the second plurality generate a bias signal to modify a bias of the second subset of the plurality fingers of the transistor.

7. The apparatus of claim 1, wherein the transistor is one of a CMOS (Complementary Metal Oxide Semiconductor) or NMOS (N-type Metal Oxide Semiconductor) transistor.

8. The apparatus of claim 7, wherein the first electrode is any of a drain electrode, a source electrode, or a gate electrode of the transistor.

9. The apparatus of claim 1, wherein the output signal is an RF (Radio Frequency) output signal.

10. A method comprising:
    receiving a signal source at an amplifier stage, the amplifier stage including a transistor having a plurality of electrodes including a first electrode;
    producing an amplifier stage output signal from the amplifier stage, wherein producing the amplifier stage output signal includes obtaining a signal from a first subset of fingers of a plurality of fingers of the first electrode; and
    obtaining a signal from a second subset of fingers of the plurality of fingers of the first electrode; and
    producing, by an integrated power detector circuit coupled to the second subset of fingers, a power detection output signal from the signal from the second subset of fingers.

11. The method of claim 10, further comprising rectifying the power detection output signal.

12. The method of claim 11, wherein the power detector circuit further includes a load resistance and a low pass filter.

13. The method of claim 12, the power detection output signal comprises a DC (Direct Current) voltage output.

14. The method of claim 10, wherein the transistor further includes a second plurality of fingers for a second electrode of the transistor.

15. The method of claim 10, wherein producing the amplitude stage output signal comprising producing an RF (Radio Frequency) output signal.

* * * * *